US009703633B2

(12) United States Patent
Zhang et al.

(10) Patent No.: US 9,703,633 B2
(45) Date of Patent: *Jul. 11, 2017

(54) CIRCUITS, APPARATUSES, AND METHODS FOR CORRECTING DATA ERRORS

(71) Applicant: MICRON TECHNOLOGY, INC., Boise, ID (US)

(72) Inventors: Yu Zhang, Xuhui District (CN); Wei Bing Shang, Pudong District (CN); En Peng Gao, Baoshan District (CN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/848,045

(22) Filed: Sep. 8, 2015

(65) Prior Publication Data

US 2015/0378826 A1  Dec. 31, 2015

Related U.S. Application Data

(63) Continuation of application No. 14/002,092, filed as application No. PCT/CN2013/000727 on Jun. 24, 2013, now Pat. No. 9,148,176.

(51) Int. Cl.
*G06F 11/10* (2006.01)
*G11C 29/42* (2006.01)
(Continued)

(52) U.S. Cl.
CPC .......... *G06F 11/1076* (2013.01); *G06F 3/064* (2013.01); *G06F 3/0619* (2013.01);
(Continued)

(58) Field of Classification Search
CPC .................................................. H03M 13/2957
(Continued)

(56) References Cited

U.S. PATENT DOCUMENTS 4,916,701 A  4/1990  Eggenberger et al.
5,581,360 A  12/1996  Matsumura et al.
(Continued)

FOREIGN PATENT DOCUMENTS

WO  2014205590 A1  12/2014

OTHER PUBLICATIONS

International Search Report and Written Opinion for Appl. No. PCT/CN2013/000727, Mailed Mar. 27, 2014.
(Continued)

*Primary Examiner* — Fritz Alphonse
(74) *Attorney, Agent, or Firm* — Dorsey & Whitney LLP

(57) ABSTRACT

One example apparatus includes a first circuit configured to receive first and second data words, to correct one or more errors in the first data word, to merge the corrected first data word and the second data word responsive to a control signal to generate a final merged data word, and to provide the final merged data word to a write circuit. The apparatus also includes a second circuit configured to also receive the first and second data words, to preliminarily merge the first and second data words responsive to the control signal to generate an initial merged data word, to generate an initial parity code for the initial merged data word, to correct the initial parity code, and to provide the corrected parity code to the write circuit.

18 Claims, 5 Drawing Sheets

(51) Int. Cl.
  *H03M 13/29* (2006.01)
  *H03M 13/00* (2006.01)
  *G06F 3/06* (2006.01)
  *G11C 29/04* (2006.01)

(52) U.S. Cl.
  CPC ........ *G06F 3/0673* (2013.01); *G06F 11/1048* (2013.01); *G11C 29/42* (2013.01); *H03M 13/2942* (2013.01); *H03M 13/6561* (2013.01); *G11C 2029/0411* (2013.01)

(58) Field of Classification Search
  USPC .................... 714/755, 763, 764, 773, 754
  See application file for complete search history.

(56) References Cited

U.S. PATENT DOCUMENTS

| | | | |
|---|---|---|---|
| 5,966,389 A | * | 10/1999 | Kiehl ................ G06F 11/1008 714/763 |
| 6,735,726 B2 | | 5/2004 | Muranaka et al. |
| 7,392,456 B2 | * | 6/2008 | Leung ................ G06F 11/1056 714/763 |
| 7,506,226 B2 | | 3/2009 | Gajapathy et al. |
| 7,954,034 B1 | | 5/2011 | Curry et al. |
| 8,132,086 B2 | | 3/2012 | Park et al. |
| 8,246,109 B2 | | 8/2012 | Wykoff et al. |
| 8,321,769 B1 | | 11/2012 | Yeo et al. |
| 8,365,036 B2 | | 1/2013 | Ramaraju et al. |
| 8,560,931 B2 | | 10/2013 | Seshadri et al. |
| 2003/0103586 A1 | | 6/2003 | Poeppelman et al. |
| 2015/0089316 A1 | | 3/2015 | Zhang et al. |

OTHER PUBLICATIONS

Notice of Preliminary Rejection for KR Appl. 10-2016-7002028 dated Nov. 30, 2016.

* cited by examiner

US 9,703,633 B2

CIRCUITS, APPARATUSES, AND METHODS FOR CORRECTING DATA ERRORS

CROSS-REFERENCE TO RELATED APPLICATIONS

This application is a continuation of U.S. patent application Ser. No. 14/002,092, filed Aug. 28, 2013, and issued Sep. 29, 2015 as U.S. Pat. No. 9,148,176, which is a 371 application claiming priority to international Application No. PCT/CN2013/000727, filed Jun. 24, 2013. These applications and patent are incorporated by reference herein in their entirety and for all purposes.

TECHNICAL FIELD

Embodiments of the invention relate generally to integrated circuits, and more particularly, in one or more of the illustrated embodiments, to correcting data errors in integrated circuits.

BACKGROUND OF THE INVENTION

As semiconductor processing technology improvements continue to allow for smaller and smaller device sizes, a number of issues arise. For example, while smaller storage elements in volatile or non-volatile memory allow for greater storage density and lower costs per unit of data storage, the small size of the individual storage elements can lead to an increase in data errors, such as various refresh time errors (also known as various retention time errors), soft errors, single event upset errors, and so forth. In some examples, physical damage to the storage elements (e.g., due to improper manufacturing of the element) can also lead to data errors, but the errors may be distributed such that utilizing repair regions may be ineffective. These soft or hard data errors corrupt data and are typically randomly distributed.

One method for mitigating the effects of these data errors is to store error correction code ("ECC") parity information (hereinafter referred to as "parity code") together with the data, and to decode the parity code when the data is read out in order to detect and/or correct any errors in the original data or the added parity code. The parity code requires some overhead both in the amount of data stored (due to the extra hits for the parity code) and in the amount of processing time required for writing to and reading from the data storage device (due to the processing time to encode and decode the ECC parity code). Nonetheless, using ECC is still generally considered to be effective and efficient in detecting and correcting randomly distributed data errors.

Some data storage devices support a data mask option whereby during a write operation, one or more portions of a stored data word retain previous data values while one or more other portions of the data word are updated with new data values. As used herein, a data word refers to a plurality of bits of information, which are normally handled or stored together as a unit, although a data mask option may cause one or more portions of the data word to be handled or stored differently from the other portion(s) of the data word. For example, in a memory, a data word stored at a particular address may include 128 bits of data, and the data mask option during a memory write operation may prevent one or more 8 bit portions of the data word from being updated from the write operation. As an even more specific example, the last 8 bits of the 128 bit data word may be masked in that only the first 120 bits of data will be written to the memory array, with the last 8 bits retaining whatever value they had prior to the write operation.

Implementing ECC in a storage device without a data mask option during a write operation is fairly straightforward because the data word and parity code to be written are not dependent on prior stored data, but are entirely a function of the new data to be written to the device. However, in a data storage device with a data mask option available, the masked portions of the data word may contain one or more errors that need to be corrected before that old data can be properly merged with the new data as required by the data mask. Also, in order to properly encode the parity code for the merged data word during the write with data mask operation, the masked portion(s) should be taken into consideration by the ECC encoder, and those masked portions should be corrected before the ECC encoder can generate the new parity code. In other words, the parity code for the merged data word is dependent not only on the new portions of the data word but also on the portions of the corrected old data word that are being masked.

In order to address this dependency, one solution may be to read out the old data word and old parity code, decode the old parity code, correct any errors in the old data word based on the decode, and then, subsequently, merge the new portion of the data word with the corrected old portions of the data word, generate a new parity code, and write the merged data word with the new parity code to the storage device. This sequential order of operations, however, may be unacceptable in some instances because the ECC decode and ECC encode operations can be relatively long and the ECC encode operation waits for the ECC decode and correction operation to complete before the new parity code can be generated and stored.

Another approach to address the data mask option in a device with ECC may be to have separate parity codes for each portion of the data word amenable to being masked. For example, continuing with the illustration of a 128 bit data word in which each 8 bit portion may be masked, each 8 bit portion of the data word may be assigned its own parity code, independent from the parity codes of each of the other $ hit portions. When a write with data mask operation is performed, the masked portions can undergo ECC decode and correction independently of the ECC encode of the new, non-masked portions. In this approach, while sequential ECC operations are avoided, the amount of overhead in both storage space and processing power is increased. Using the 128 bit example, each 8 bit portion may have a parity code that is 4 bits long, thus requiring a total of 64 parity bits (50% overhead), and 16 independent ECC encode/decode circuits may be needed to separately encode or decode the parity codes for each 8 bit portion. In comparison, for the sequential approach described above, only 8 parity bits may be required for the 128 bit data word (6.25% overhead), and a single ECC circuit may both decode/correct and encode the parity codes, because the EEC encode operation cannot proceed until the ECC decode operation is complete.

DETAILED DESCRIPTION

Certain details are set forth below to provide a sufficient understanding of embodiments of the invention. However, it will be clear to one skilled in the an that embodiments of the invention may be practiced without these particular details. Moreover, the particular embodiments of the present invention described herein are provided by way of example and should not be used to limit the scope of the invention to these particular embodiments, in other instances, well-known circuits, control signals, timing protocols and software operations have not been shown in detail in order to avoid unnecessarily obscuring the invention.

Figure 1:
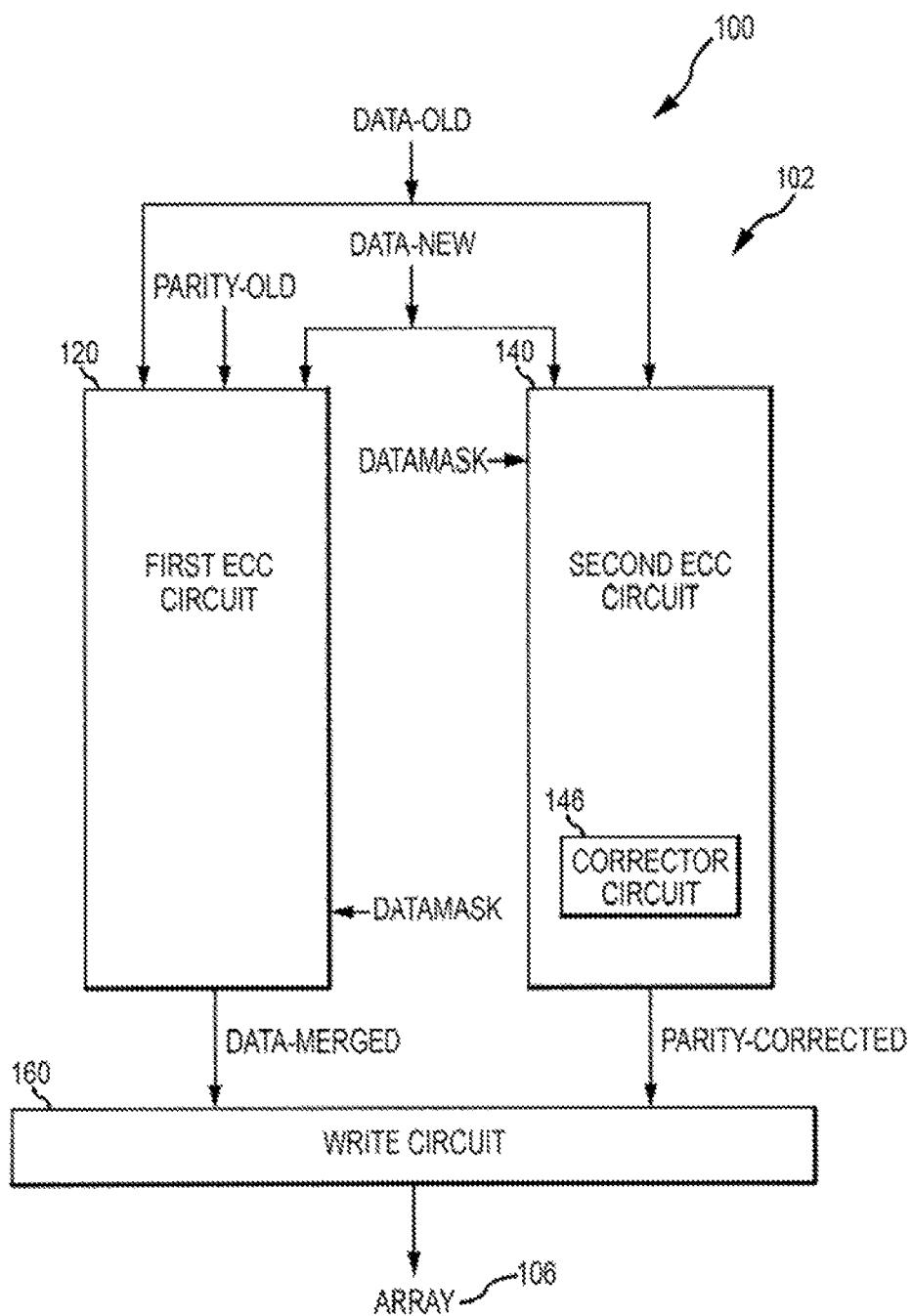
FIG. 1 is a block diagram of an apparatus for correcting data errors according to an embodiment of the present invention.

FIG. 1 illustrates an apparatus 100 for correcting data errors, according to an embodiment of the invention. As used herein, apparatus may refer to, for example, an integrated circuit, a memory device, a memory system, an electronic, device or system, a smart phone, a tablet, a computer, a server, etc, in one example, the apparatus 100 includes a data storage device, such as an array 106 of volatile or non-volatile memory. In other embodiments, the data storage device may be an intermediate storage device, such as a buffer or a cache. The apparatus 100 is configured to store a plurality of data words at respective addresses within the array 106, and to read stored data words from the array 106. In one example, each data word may include 128 bits of data, whereas in other examples, each data word may include 32 data bits, 64 data bits, 256 data bits, 512 data bits, and so forth. The data words stored in the array 106 may be subject to soft or hard data errors—for example, one or more data bits within the data words may "flip" and change data values in between the time that the data bits are stored to the array 106 and the time when they are read. In other examples, one or more storage devices in the array 106 may be damaged, thereby preventing the correct storage and reading of one or more data bits. In general, any mechanism may cause one or more bits in data words read from the array 106 to differ from how those respective bits were supposed to have been written into the array 106.

In order to mitigate the affects of such data errors, the apparatus 100 includes an error correction and/or detection code ("ECC") system 102, whereby a parity code (which may include one or more parity bits) are generated for each data word and stored in the array 106, ECC, as used herein, includes any type of error detection and/or error correction methodology—for example, the ECC system 102 of the apparatus 100 may in some instances detect one or more data errors and may additionally correct one or more errors in some embodiments. The ECC system 102 may be based on a Hamming code (including an extended Hamming code), a cyclic redundancy check, or any other error detection author error correction methodology. The parity code generated by the ECC system 102 and stored in the array 106 with the associated data words represent information about some portion s) or the entirety of the associated data word, and may subsequently be used to detect and/or correct errors in the data word when the data word is read out from the array 106. For brevity, an example ECC system 102 and code that can detect and correct as single bit data error in a data word will be described herein, but it will be appreciated that the principles described herein can be extended to detecting and/or correcting any number of data errors.

Referring again to FIG. 1, the ECC system 102 includes a first ECC circuit 120 and a second ECC circuit 140 that may generally operate in parallel. The first ECC circuit 102 receives a first data word DATA-OLD and a parity code PARITY-OLD associated with the first data word DATA-OLD. The first data word DATA-OLD may be an old data word previously stored and read out from the array 106. While it was stored in the array 106, or as it was being stored into the array 106, one or more data bits of the first data word DATA-OLD may have changed values from their intended values, and thus, the first data word DATA-OLD provided to the first ECC circuit 120 may have one or more bits of data errors. The first ECC circuit 120 also receives a second data word DATA-NEW, which may be a new data word, of which at least some portions are to be stored in the array 106 in place of respective portions of the first data word DATA-OLD (e.g., at least some portions of the second data word DATA-NEW are to overwrite respective portions of the first data word DATA-OLD).

The first ECC circuit 120 is configured to selectively correct one or more data errors in the first data word DATA-OLD based on the first data word DATA-OLD and its associated parity code PARITY-OLD when one or more data errors are detected in the first data word DATA-OLD. The corrected data word may correspond to the data word that was supposed to have been stored in the array 106. During operation of the ECC system 102, the first data word DATA-OLD provided to the first ECC circuit 120 may not always have one or more data efforts. In fact, in some examples, relatively few of the first data words DATA-OLD read out from the array 106 and provided to the first ECC circuit 120 will have any data errors at all. It will be understood that, although the first ECC circuit 120 is configured to correct one or more data errors in the data words DATA-OLD provided to it when such errors are detected by the first ECC circuit 120, when a data word DATA-OLD provided to the first ECC circuit 120 does not have any data errors, the first ECC circuit 120 will not "correct" the data bits in the data word, as there are no errors to correct.

The first ECC circuit 120 is also configured to selectively merge the corrected data word (i.e., the first data word as corrected by the first ECC circuit or the uncorrected first data word if no data errors were detected in the same) with the second data word DATA-NEW responsive to a control signal, such as a data mask signal DATAMASK. The first ECC circuit 120 may generate a final merged data word DATA-MERGED based on one or more portions of the corrected data word and one or more portions of the second data word DATA-NEW, with the control signal DATAMASK determining which portions of which data word are used to generate the final merged data word DATA-MERGED. In other words, the control signal DATAMASK may cause the first ECC circuit 120 to retain one or more portions of the corrected data word from being replaced by one or more corresponding portions of the second data word DATA-NEW dating a data write operation.

In some cases, responsive to the control signal DATAMASK, the entirety of one of the corrected data word or the new data word DATA-NEW may be provided as the final merged data word DATA-MERGED the control signal DATAMASK may entirely mask the corrected data word such that the final merged data word DATA-MERGED is identical to the corrected data word, or, on the other hand, the control signal DATAMASK may not mask any of the corrected data word such that the final merged data word DATA-MERGED is identical to the second data word DATA-NEW. However, in other examples, the control signal DATAMASK may mask one or more portions of the corrected data word such that those masked portions are provided in their respective places in the final merged data word DATAMERGED, with the other portions of the final merged data word DATA-MERGED coming from respective portions of the second data word DATA-NEW.

The portions of the data words that are masked by the control signal DATAMASK may in some examples be 8 bit (1 byte) portions, but may generally be any size. If the data words are 128 bits long and the maskable portions are 8 bits long, for example, there may be 16 separate portions that may or may not be masked, based on the control signal DATAMASK.

Referring again to FIG. 1, the first ECC circuit 120 may provide the final merged data word DATA-MERGED to a write circuit 160, which may subsequently write the final merged data word DATA-MERGED to the array 106 together with an associated parity code PARITY-CORRECTED, as described in more detail below.

The second ECC circuit 140 may be separate and distinct from the first ECC circuit 120 in some embodiments, and may operate at least partially contemporaneously with the first ECC circuit 120. In other words, the time during which the second ECC circuit 140 operates as described herein may at least partially overlap the time during which the first ECC circuit 120 operates as described herein—e.g., such that one of the circuits 120, 140 begins its respective operation(s) before the other of the circuits 120, 140 has finished its respective operation(s). This parallel operation of the first and second ECC circuits 120, 140 may in some examples improve the timing of reading from and/or writing to the array 106 as compared to an apparatus in which the operations of similar first and second ECC circuits operate in series in that the second ECC circuit does not begin operation until the first ECC circuit has completed operations for course, in a sequential operation, only a single ECC circuit may be needed).

The second ECC circuit 140 receives the first data word DATA-OLD and the second data word DATA but does not receive the corrected first data word from the first ECC circuit 120. The second ECC circuit 140 preliminarily merges the first data word DATA-OLD and the second data word DATA-NEW responsive to the control signal DATA-MASK and thereby generates an initial merged data word. The control signal DATAMASK provided to the first ECC circuit. 120 is generally the same as the control signal DATAMASK provided to the second ECC circuit 140. The result of the preliminary merge is an "initial" merged data word because any portions of the first data word DATA-OLD that are merged into the initial merged data word may include one or more data errors because the input to the second ECC circuit 140 is "raw" data words DATA-OLD from the array 10$ that may include one or more data errors.

The second ECC circuit 140 also generates an initial parity code associated with the initial merged data word, and corrects the initial parity in a corrector circuit 146. The corrected parity code PARITY-CORRECTED is provided by the second ECC circuit 140 to the write circuit 160, which, as mentioned above, writes the corrected parity code PARITY-CORRECTED to the array 106 together with the final merged data word DATA-MERGED. The corrected parity code ma be representative of the entire final merged data word DATA-MERGED in some examples, or in other examples may be representative of two or more portions (e.g., with each portion corresponding to a section of the data word that may be masked) of the final merged data word DATA-MERGED).

The initial parity code may need to be corrected because it was generated based on the initial merged data word, which may contain one or more data errors. If the initial merged data word contains one or more errors, as compared to the final merged data word DATA-MERGED generated by the first ECC circuit 120, the initial parity code generated torn the initial merged data word will have one or more errors as compared to what a parity code for the final merged data word DATA-MERGED should have. In other words, the second ECC circuit 140 corrects the initial parity code such that the corrected parity code PARITY-CORRECTED is the parity code for the final merged data word DATA-MERGED. As described in more detail below, in those instances where there are no data errors in the portions of the first data word DATA-OLD that are merged into the final merged data word DATA-MERGED the initial parity code will not need to be corrected, and will simply be passed through the corrector circuit 146 as the corrected parity code PARITY-CORRECTED.

Operating the first and second ECC circuits 120, 140 in parallel allows the first parity circuit 120 to correct a data effort(s) in the first data word DATA-OLD while at least partially contemporaneously allowing the second ECC circuit 140 to generate the initial parity code as if there were no errors in the portions of the first data word DATA-OLD that are merged into the final data word DATA-MERGED. Because these two operations are relatively lengthy, and the correction of the initial parity code is relatively quick, the read-modify-write of the write with data mask operation can be more quickly and efficiently processed than in the sequential ECC decode and subsequent ECC encode procedure described above.

Figure 2:
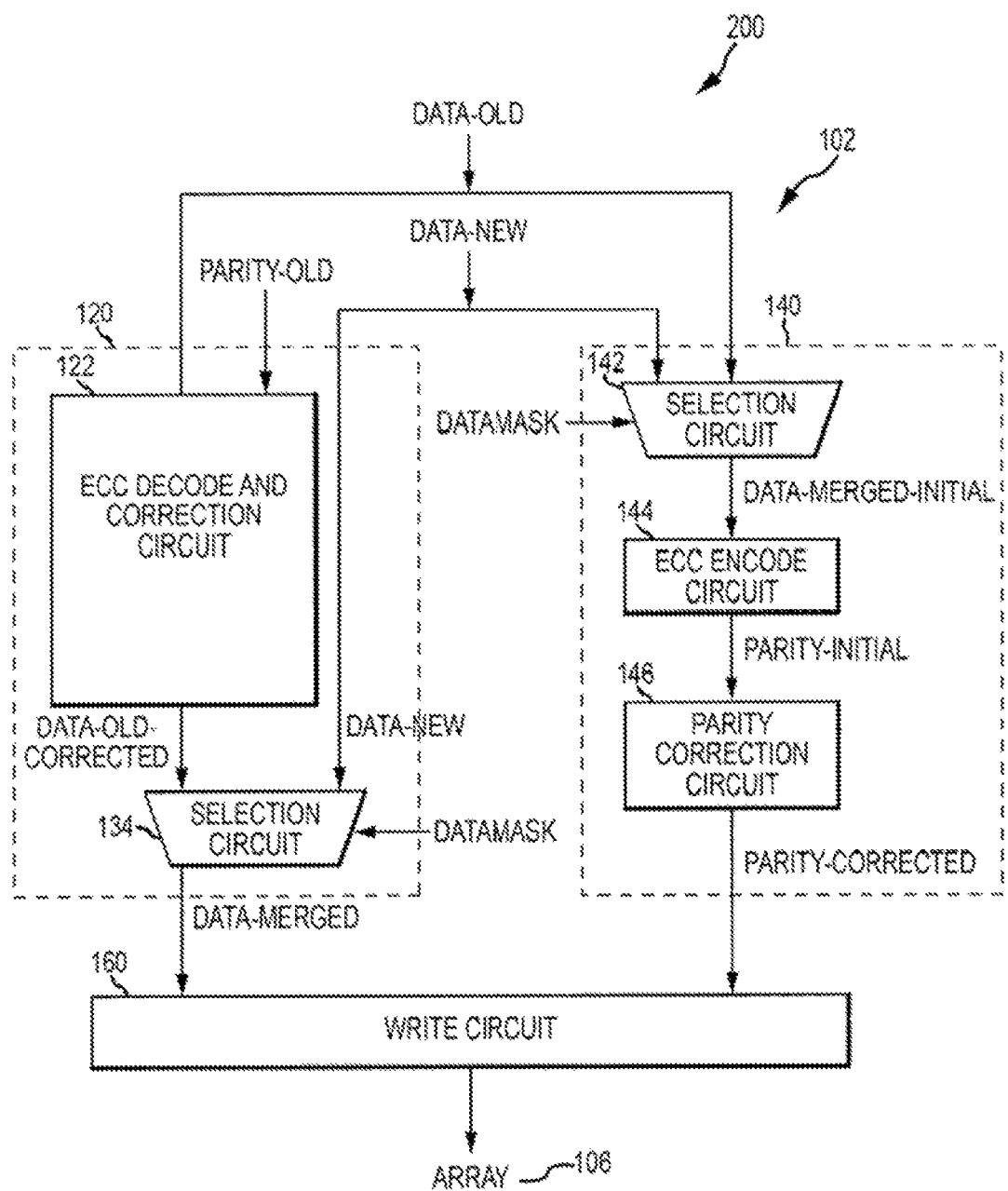
FIG. 2 is a block diagram of an apparatus for correcting data errors according to an embodiment of the present invention.

FIG. 2 illustrates an apparatus 200 for correcting data errors, according to an embodiment of the invention. Like the apparatus 100 illustrated in FIG. 1, the apparatus 200 illustrated in FIG. 2 includes an ECC system 102 with first and second ECC circuits 120, 140, and a write circuit 160. Furthermore, the first ECC circuit 120 in FIG. 2 includes an ECC decode and correction circuit 122 and a first selection circuit 134. The ECC decode and correction circuit 122 receives the first data word DATA-OLD and its associated parity code PARITY-OLD, decodes the parity code PARITY-OLD and the first data word DATA-OLD to determine if there are one or more data errors in the first data word DATA-OLD, and, if so, corrects, those one or more errors to provide the corrected data word DATA-OLD-CORRECTED.

The first selection circuit 134 in FIG. 2 receives the corrected data word DATA-OLD-CORRECTED and the second data word DATA-NEW, along with a control signal DATAMASK. The first selection circuit 134 may include a plurality of multiplexers which, depending on the control signal DATAMASK, select between portions of each of the corrected data word DATA-OLD-CORRECTED and the second data word DATA-NEW in order to generate the final merged data word DATA-MERGED.

The second ECC circuit 140 in FIG. 2 includes a second selection circuit 142, an ECC encode circuit 144, and a parity correction circuit 146. The second selection circuit 142 receives the first data word DATA-OLD and the second data word DATA-NEW, along with the control signal DATAMASK. The second selection circuit may include a plurality of multiplexers which, depending on the control signal DATAMASK, select between portions of each of the first data word DATA0OLD and the second data word DATA-MASK in order to preliminarily generate the initial merged data word DATA-MERGED-INITIAL. The initial merged data word DATA-MERGED-INITIAL may include one or more data errors because the first data word DATA-OLD was provided without first passing through the ECC decode and correction circuit 122 of the first ECC circuit 120.

The initial merged data word DATA-MERGED-INITIAL is then provided to the ECC encode circuit 144, which generates an initial parity code PARITY-INITIAL based on the initial merged data word DATA-MERGED-INITIAL. The initial parity code PARITY-INITIAL is in turn provided to the parity correction circuit 146, which corrects the initial parity code in the event that there are one or more data errors in the masked portions of the first data word DATA-OLD, and provides the corrected parity code PARITY-CORRECTED to the write circuit 160, which in turn writes the corrected parity code PARITY-CORRECTED along with the final merged data word DATA-MERGED from the first ECC circuit 120 to the array 106.

Thus the second ECC circuit 140 merges the first and second data words DATA-OLD and DATA-NEW and generates an associated initial parity code as if there were no errors in the initial merged data word DATA-MERGED-INITIAL, or as if the initial merged data word DATA-MERGED-INITIAL was going to be written to the array 106 with the initial parity code PARITY-INITIAL. However, as described above, the parity correction circuit. 146 corrects that initial parity code PARITY-INITIAL to bring it into alignment with what the parity code should be for the final merged (and corrected) data word DATA-MERGED.

Figure 3:
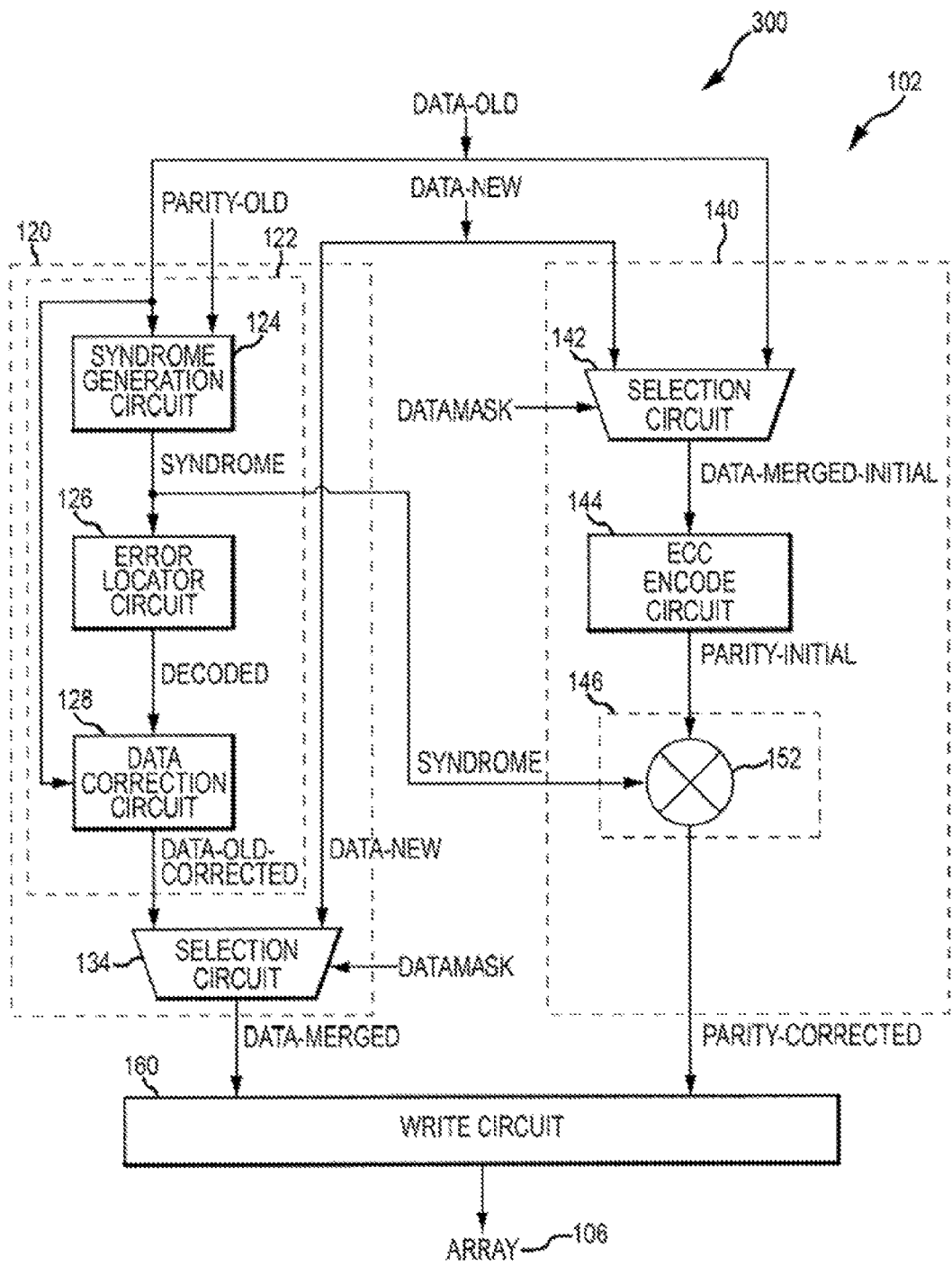
FIG. 3 is a block diagram of an apparatus for correcting data errors according to an embodiment of the present invention.

FIG. 3 illustrates an apparatus 300 for correcting data errors, according to an embodiment of the invention. Like the apparatus 100 illustrated in FIG. 1 and the apparatus 200 illustrated in FIG. 2, the apparatus 300 illustrated in FIG. 3 includes an ECC system 102 with first and second ECC circuits 120, 140, and a write circuit 160. Furthermore, like the first ECC circuit 120 in FIG. 2, the first ECC circuit 120 in FIG. 3 includes an ECC decode and correction circuit 122, and a first selection circuit 134. The ECC decode and correction circuit 122 in FIG. 3 includes a syndrome generation circuit 124 that receives the first data word DATA-OLD and its associated parity code PARITY-OLD, and generates a syndrome SYNDROME representative of one or more data errors in the first data word DATA-OLD as received. The syndrome SYNDROME is provided to the error locator circuit 126, and as described in more detail below, is also provided to the parity correction circuit 146.

The error locator circuit 126 decodes the syndrome to provide physical location(s) DECODED within the first data word DATA-OLD of one or more data errors. The error locator circuit 126 may be a typical address decoder in some embodiments. If for example, the syndrome is 8 bits long and is indicative of a single data bit error, the error locator circuit may decode the 8 bit syndrome and provide a 128 bit long DECODED signal, with all values of the DECODED signal being binary 0 other than the location in the first data word DATA-OLD where there is a data error, which may have a value of binary 1.

The physical location(s) DECODED of the data errors are provided, together with the first data word DATA-OLD to the data correction circuit 128, which corrects the one or more data errors. In some examples, the data correction circuit 128 may include a plurality of XOR gates, each of which receives as its inputs one bit of the first data word DATA-OLD and a corresponding physical location DECODED. Continuing on with the example of the 8 bit syndrome and 128 bit long DECODED signal, if there is an error in the first data word DATA-OLD, the location of that error would be given by a binary 1 in the DECODED signal and when that binary one is XORed with the incorrect value in the first data word DATA-OLD, the value at that location would be restored to its correct binary value.

The data correction circuit 128 thus provides the corrected data word DATA-OLD-CORRECTED to the first selection circuit 134 which also receives the second data word DATA-NEW and the control signal DATAMASK, and provides the final merged data word DATA-MERGED, as described above with reference to FIG. 2.

Also like the apparatus 200 illustrated in FIG. 2, the apparatus 300 illustrated in FIG. 3 includes a second ECC circuit 140, which in turn includes a second selection circuit 142, an ECC encode circuit 144, and a parity correction circuit 146. The parity correction circuit 146 may in some embodiments include a plurality of XOR logic gates 152 configured to receive as input the initial parity code PARITY-INITIAL and the syndrome SYNDROME from the syndrome generating circuit 124. By comparing (e.g., XORing) the initial parity code PARITY-INITIAL with the syndrome SYNDROME, the parity correction circuit 146 may correct the initial parity code PARITY-INITIAL so that it corresponds with the corrected and final merged data word DATA-MERGED. As mentioned above, the syndrome SYNDROME may contain information regarding the location of a data error in the first data word DATA-OLD, which can be used to correct that data error through, fir example, an XOR gate in the data correction circuit 128. Because of the way in which the syndrome and the parity codes are generated, that same location information in the syndrome SYNDROME may also be used to locate and correct art incorrect value of the initial parity code PARITY-INITIAL in the parity correction circuit 146 through, for example, an XOR gate 152, because the incorrect value in the initial parity code PARITY-INITIAL results from the same data error in the first data word DATA-OLD that is corrected in the data correction circuit 128.

In some embodiments, a signal (not shown), may be provided to the parity correction circuit 146 to determine whether the initial parity code PARITY-INITIAL should be passed along as-is to the write circuit 160 as the corrected parity code PARITY-CORRECTED, or whether one or more data bits need to be changed in the initial parity code PARITY-INITIAL first. For example, if there are no data errors in the first data word DATA-OLD, particularly if there are no data errors in the masked portions of the first data word DATA-OLD, then the initial parity code PARITY-INITIAL may not need to be modified. Thus, the parity correction circuit 146 may in some embodiments make it determination of whether there is a data error in the masked portions of the first data word DATA-OLD at all, and if not, then just pass the initial parity code PARITY-INITIAL on to the write circuit 160. In other embodiments, however, the initial parity code PARITY-INITIAL may always be compared (e.g., XORed) together with the syndrome SYNDROME and, if there are no errors in the first data word DATA-OLD, then the syndrome SYNDROME will be all binary 0s—in which case an XOR function would simply pass the initial parity code PARITY-INITIAL without any changes to the write circuit 160 in any event.

Figure 4:
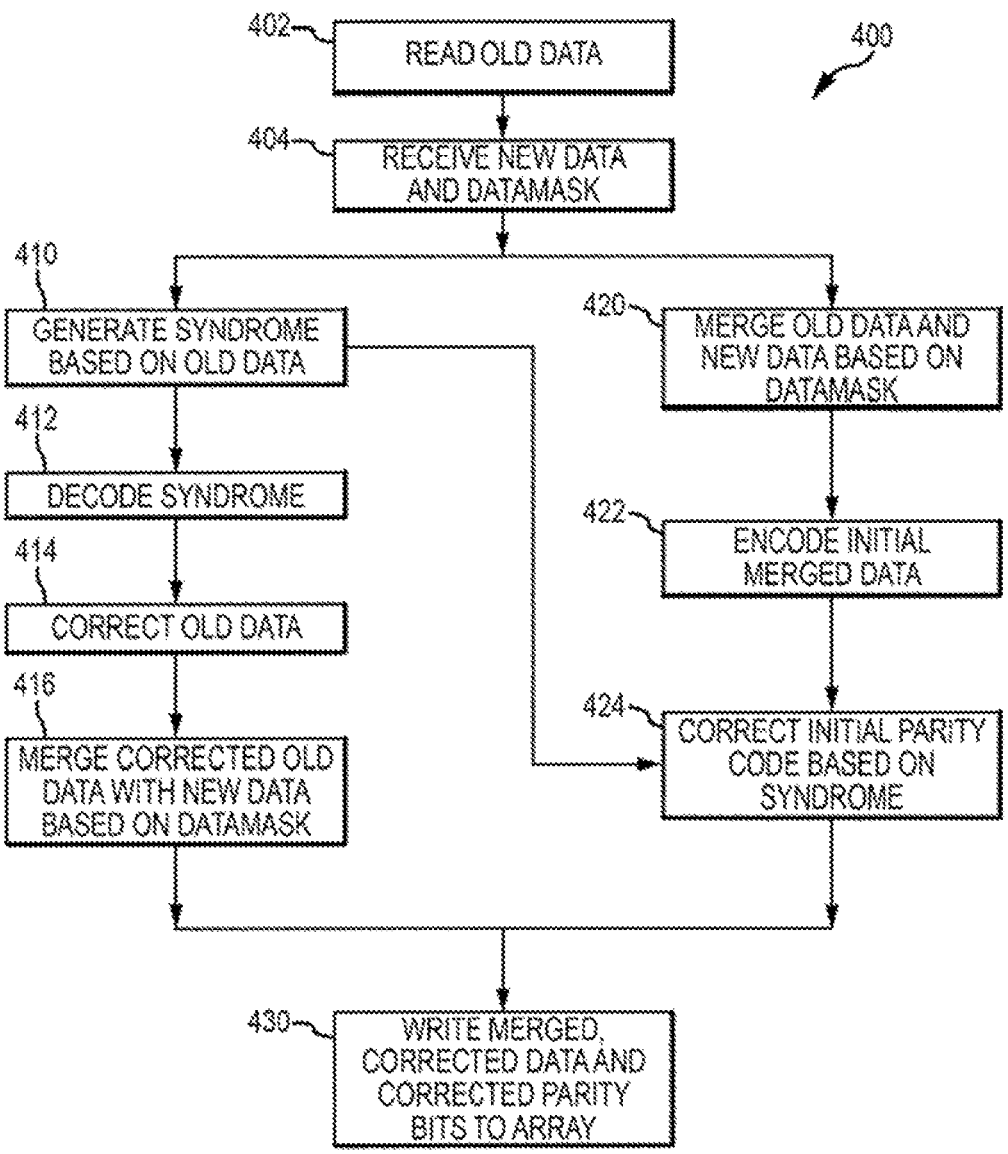
FIG. 4 is a flow diagram for correcting data errors according to an embodiment of the invention.

The operation of the apparatuses 100, 200, 300 in FIGS. 1, 2, and 3, will now be described with reference to FIG. 4, which illustrates a flow chart of operations 400 for correcting data errors during a write with data mask operation, according to an embodiment of the invention.

In operation 402, a first data word DATA-OLD (and its associated parity code PARITY-OLD) is read from array 106, and in operation 404, the first data word DATA-OLD and a second data word DATA-NEW are received by first and second. ECC circuits 120, 140. In operation 410, the syndrome generator 124 of the first ECC circuit 120 generates a syndrome SYNDROME based on the first data word DATA-OLD and its associated parity code PARITY-OLD. In operation 412, the syndrome SYNDROME is decoded to provide locations DECODED of one or more data errors in the first data word DATA-OLD. In operation 414, the DECODED location information is used to correct the first data word DATA-OLD, which is merged together with the second data word DATA-NEW in operation 416 based on a control signal DATAMASK. Operations 410-418 proceed at least partially contemporaneously with operations 420-424, which will now be described.

In operation 420, the first data word DATA-OLD is preliminarily merged with the second data word DATA-NEW based on the control signal DATAMASK to generate the initial merged data word DATA-MERGE-INITIAL in operation 422, an initial parity code is generated by encoding the initial merged data word DATA-MERGE-INITIAL. Then, in operation 424 the initial parity code is corrected based on the syndrome SYNDROME generated in operation 410 to generate the corrected parity code PARITY-CORRECTED. Then, in operation 430, the final merged data word DATA-MERGED is written together with the corrected parity code PARITY-CORRECTED to the array 106.

With reference to operation 424, as mentioned above, before the initial parity code PARITY-INITIAL is corrected using the syndrome SYNDROME, in some examples, a check is first made to determine whether there is a data error in the first data word DATA-OLD at all (or at least those portions that are being masked), and if not, then no changes are made to the initial parity code PARITY-INITIAL but it is instead directly passed through as the corrected parity code PARITY-CORRECTED to write circuit 160. In other examples, however, no check is made, and the initial parity code PARITY-INITIAL is always "corrected," with the understanding that if no bits are incorrect, then the operation of correcting the code does not alter the data values of it.

There are instances in which the initial parity code PARITY-INITIAL may not need to be corrected, for example,—when there is no data error in the first data word DATA-OLD or its associated parity code PARITY-OLD, when there is only a data error in a portion of the first data word DATA-OLD which is not masked, and when there is only a data error on the parity code PARITY-OLD that is retrieved with the first data word. DATA-OLD. In these instances, the initial parity code correctly corresponds to the final merged data word DATA-MERGED, and no corrections are needed, in another instance in which there is as data error in a portion of the first data word DATA-OLD which is being masked, the initial parity code PARITY-INITIAL will be incorrect and thus may be corrected by the parity correction circuit 146 so that it properly corresponds with the final merged data word DATA-MERGED. In this last situation, the syndrome SYNDROME may determine the location of not only the error in the first data word DATA-OLD but may also determine the location of the incorrect bit or bits in the initial parity code PARITY-INITIAL.

Figure 5:
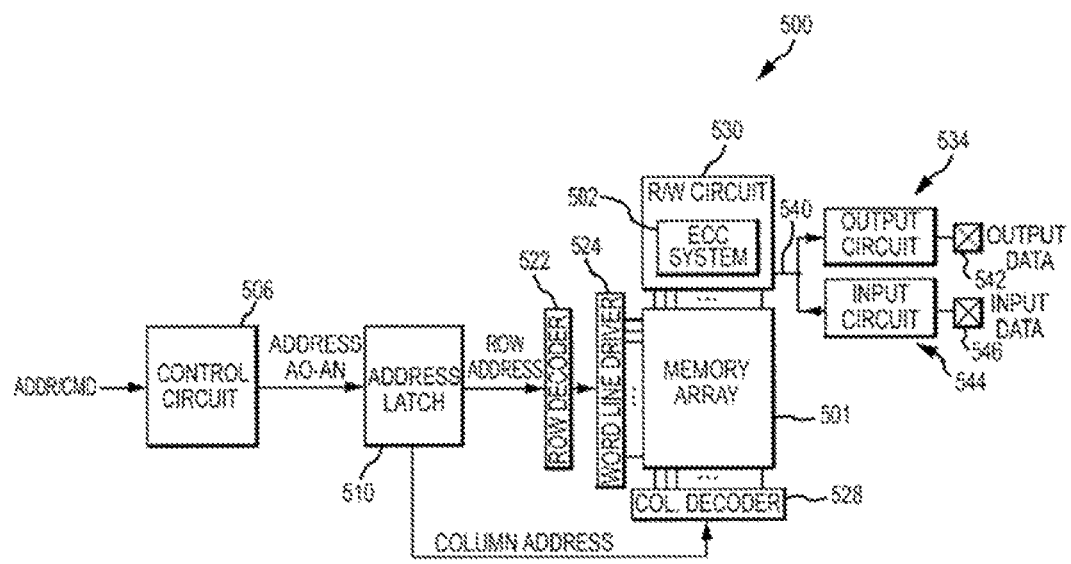
FIG. 5 is as block diagram of as memory according to an embodiment of the invention.

FIG. 5 illustrates a portion of a memory 500 according to an embodiment of the present invention. The memory 500 includes an array 501 of memory cells, which may be, for example, DRAM memory cells, SRAM memory cells, flash memory cells, or some other types of memory cells, and may correspond to the array 106 shown in FIGS. 1, 2, and 3. The memory 500 includes a control circuit 506 that receives memory commands and addresses through an ADDR/CMD bus. The control circuit 500 provides control signals, based on the commands received through the ADDR/CMD bus. The control circuit 506 also provides row and column addresses to the memory 500 through an address bus and an address latch 510. The address knelt then outputs separate, column addresses and separate row addresses.

The row and column addresses are provided by the address latch 510 to a row address decoder 522 and a column address decoder 528, respectively. The column address decoder 528 selects bit lines extending through the array 502 associated with respective column addresses. The row address decoder 522 is connected to word line driver 524 that activates respective rows of memory cells in the array 502 associated with received row addresses. The selected data line (e.g., a hit line or bit lines) associated with a received column address are coupled to a read/write circuit 530 to provide read data to a data output circuit 534 via an input-output data bus 540. An output pad 542 coupled to the data output circuit 534 is used for electrically coupling to the memory 500. Write data are provided to the memory array 502 through as data input circuit 544 and the memory array read/write circuit 530. An input pad 546 coupled to the data input circuit 542 is used for electrically coupling to the memory 500. The control circuit 506 responds to memory commands and addresses provided to the ADDR/CMD bus to perform various operations on the memory array 502. In particular, the control circuit 506 is used to provide internal control signals to read data from and write data to the memory array 502.

In some embodiments, the read/write circuit 530 includes an ECC system 502, which may be for example the ECC system 102 illustrated in FIGS. 1, 2, and/or 3, and described herein. The ECC system 502 may thus receive data words from the memory array 501 with one or more errors, and, in the case of a write with data mask operation, correct those one or more errors if needed, as described above in more detail.

From the foregoing it will be appreciated that, although specific embodiments of the invention have been described herein for purposes of illustration, various modifications may be made without deviating from the spirit and scope of the invention. For example, FIGS. 1, 2, 3, and 5 illustrate embodiments of ECC systems 102, 502, FIGS. 1, 2, and 3 illustrate embodiments of parity correction circuits 146. FIGS. 2 and 3 illustrate embodiments of selection circuits 134, 142, and so forth. However, other ECC systems, parity correction circuits, selection circuits, and so forth may be used, which are not limited to having the same design, and may be of different designs and include circuitry different from the circuitry in the embodiments illustrated in these figures.

While this disclosure has described the operation of an ECC system 102, 502 during a write with data mask operation, it will be understood that the ECC systems 102, 502 described herein generally function similar to traditional ECC systems during other operations. For example, during a read operation, the KC systems 102, 502 read out the first data word DATA-OLD together with its associated parity code PARITY-OLD, and detect and/or correct any data errors in the first data word DATA-OLD. Similarly, for a write operation without a data mask, the ECC systems 102, 502 generate a parity code for the second data word DATA- NEW that can be stored together with the second data word DATA-NEW in the array 106.

Also, as previously mentioned, while this disclosure described an example in which an ECC code is used that is capable of detecting and correcting one bit of data error, other examples within the scope of this disclosure include ECC codes that can detect two bit errors and correct one bit error, can correct two bit errors, can merely detect it single hit error, and so forth. In general, any error detection and/or error correction methodology may be used.

Accordingly, the invention is not limited to the specific embodiments of the invention described herein.

What is claimed is:

1. An apparatus, comprising:
   a storage;
   an input pad; and
   an ECC circuit configured to:
   receive write data accompanied with data mask information from the input pad,
   receive read data from the storage,
   replace one or more portions of the read data with one or more portions of the write data responsive, at least in part, to the data mask information to generate a first merged data without correcting error bit or bits that may be contained in the read data,
   generate a first parity code from the first merged data,
   correct the first parity code,
   correct one or more errors in the read data based, at least in part, on the read data and an associated second parity code for the read data, and
   merge the corrected read data and the write data responsive, at least in part, to the data mask information to generate a second merged data.

2. The apparatus of claim 1, wherein the data mask information is configured to retain one or more portions of the corrected read data such that the one or more portions of the corrected read data is incapable of being replaced by one or more corresponding portions of the write data during a data write operation.

3. The apparatus of claim 1, wherein the ECC circuit is configured to initiate merging the read data and the write data prior to completing correction of the read data.

4. The apparatus of claim 1, wherein the ECC circuit comprises a plurality of XOR logic gates that are configured to receive as input the first parity code and a syndrome generated from the read data and the associated second parity code for the read data.

5. The apparatus of claim 1, wherein the corrected first parity code is representative of the second merged data.

6. An apparatus, comprising:
   a storage;
   an input pad; and
   an ECC circuit configured to:
   receive write data accompanied with data mask information from the input pad,
   receive read data from the storage,
   replace one or more portions of the read data with one or more portions of the write data responsive, at least in part, to the data mask information to generate a first merged data without correcting error bit or bits that may be contained in the read data, and
   correct one or more errors in the read data responsive, at least in part, to the read data and an associated first parity code for the read data,
   wherein the ECC circuit is configured to initiate merging the read data and the write data prior to completing correction of the read data and to generate a second parity code from the first merged data.

7. The apparatus of claim 6, wherein the ECC circuit is further configured to correct the second parity code.

8. The apparatus of claim 6, further comprising:
   a first selection circuit configured to merge the read data and the write data responsive, at least in part, to the data mask information:
   an ECC encode circuit configured to generate the second parity code based on the first merged data;
   an ECC decode and correction circuit configured to correct one or more errors in the read data responsive, at least in part, to the read data and the associated first parity code for the read data; and
   a second selection circuit configured to merge the corrected read data and the write data responsive, at least in part, to the data mask information and generate a second merged data.

9. The apparatus of claim 8, wherein the ECC decode and correction circuit comprises:
   a syndrome generation circuit configured to generate a syndrome;
   an error locator circuit configured to decode the syndrome; and
   a data correction circuit configured to correct the read data based on the decoded syndrome.

10. The apparatus of claim 9, wherein the generation of the second parity code and generation of the syndrome are performed at least partially contemporaneously.

11. The apparatus of claim 8, wherein the first and second selection circuits comprise one or more multiplexers.

12. The apparatus of claim 8, wherein the second selection circuit is configured to generate the second merged data, and the second merged data includes one or more portions of the corrected read data and one or more portions of the write data.

13. The apparatus of claim 6, wherein the generation of the second parity code and correction of one or more errors in the read data are performed at least partially contemporaneously.

14. A method, comprising:
   receiving, by an ECC circuit, first data accompanied with data mask information;
   receiving, by the ECC circuit, second data from a storage; and
   replacing, by the ECC circuit, one or more portions of the first data with one or more portions of the second data to generate merged data, the merging being performed in response, at least in part, to the data mask information without correcting error bit or bits that may be contained in the second data,
   generating a first parity code based on the merged data; and
   correcting the error bit or bits of the second data based, at least in part, on the second data and a second parity code associated with the second data to generate corrected second data.

15. The method of claim 14, further comprising:
   correcting the first parity code based, at least in part, on the second data and the second parity code to generate a corrected first parity code.

16. The method of claim 15, further comprising:
   merging the corrected second data with the first data in response, at least in part, to the data mask information to generate third data.

17. The method of claim 16, further comprising:
  writing the third data and the corrected first parity code into the storage.

18. The method of claim 14, wherein the generating and the correcting are performed at least partially in parallel to each other.

* * * * *